(12) United States Patent
Huang

(10) Patent No.: US 10,056,898 B2
(45) Date of Patent: Aug. 21, 2018

(54) INPUT STAGE OF CHIP AND METHOD FOR CONTROLLING SOURCE DRIVER OF CHIP

(71) Applicant: MEDIATEK INC., Hsin-Chu (TW)

(72) Inventor: Mu-Chen Huang, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/152,513

(22) Filed: May 11, 2016

(65) Prior Publication Data
US 2017/0093395 A1    Mar. 30, 2017

Related U.S. Application Data

(60) Provisional application No. 62/234,670, filed on Sep. 30, 2015.

(51) Int. Cl.
| | |
|---|---|
| H03K 17/68 | (2006.01) |
| H03K 17/687 | (2006.01) |
| H03F 3/50 | (2006.01) |
| H03K 5/08 | (2006.01) |
| H03F 1/32 | (2006.01) |

(52) U.S. Cl.
CPC ....... *H03K 17/6871* (2013.01); *H03F 1/3205* (2013.01); *H03F 3/505* (2013.01); *H03K 5/08* (2013.01); *H03F 2200/69* (2013.01)

(58) Field of Classification Search
CPC . H03F 1/34; H03F 3/187; H03F 3/195; H03F 3/245; H03F 1/3247; H03F 1/565; H03K 17/08128; H03K 17/165; H03K 17/18; H03K 4/023; H03K 5/08
USPC .................. 327/108, 109, 110, 111, 112
See application file for complete search history.

(56) References Cited

U.S. PATENT DOCUMENTS

| | | | | |
|---|---|---|---|---|
| 5,847,597 | A * | 12/1998 | Ooishi | G11C 5/143 327/537 |
| 7,133,074 | B1 * | 11/2006 | Brehmer | H04N 5/335 348/241 |
| 8,581,634 | B2 | 11/2013 | Agarwal et al. | |
| 2004/0021796 | A1 * | 2/2004 | Fang | H04N 5/18 348/694 |
| 2012/0182049 | A1 * | 7/2012 | Garbossa | H02M 3/155 327/109 |
| 2013/0313974 | A1 * | 11/2013 | Fan | H05B 33/0815 315/127 |

FOREIGN PATENT DOCUMENTS

CN    103294089 B    2/2015

* cited by examiner

*Primary Examiner* — John Poos
(74) *Attorney, Agent, or Firm* — Winston Hsu

(57) ABSTRACT

An input stage of a chip includes a source driver and a sensing and clamping circuit. The source follower is arranged for receiving an AC-coupled signal to generate an output signal at an output terminal. The sensing and clamping circuit is coupled to the source follower, and is arranged for clamping the output terminal of the source follower at a fixed DC voltage.

17 Claims, 5 Drawing Sheets

INPUT STAGE OF CHIP AND METHOD FOR CONTROLLING SOURCE DRIVER OF CHIP

CROSS REFERENCE TO RELATED APPLICATIONS

This application claims the priority of U.S. Provisional Application No. 62/234,670, filed on Sep. 30, 2015, which is included herein by reference in its entirety.

BACKGROUND

In a television system adopting composite video broadcast signal (CVBS) or video graphics array (VGA) standard, signals are fed into an integrated circuit through AC coupling capacitors, and an input stage is generally implemented by source followers to provide driving ability and high input impedance. However, an input DC level of the source follower is generally determined by a clamping circuit but an output DC level is not well defined, causing worse linearity of the signal path and potential reliability issue if low-voltage devices are used in succeeding circuits.

SUMMARY

It is therefore an objective of the present invention to provide an input stage of the IC, which can improve the linearity of the source follower in the input stage, to solve the above-mentioned problem.

According to one embodiment of the present invention, an input stage of a chip comprises a source driver and a sensing and clamping circuit. The source follower is arranged for receiving an AC-coupled signal to generate an output signal at an output terminal. The sensing and clamping circuit is coupled to the source follower, and is arranged for clamping the output terminal of the source follower at a fixed DC voltage.

According to one embodiment of the present invention, a method for controlling a source follower within a chip is disclosed, wherein the source follower for receiving an AC-coupled signal to generate an output signal at an output terminal The method comprises: clamping the output terminal of the source follower at a fixed DC voltage.

According to one embodiment of the present invention, a chip comprises a first driving circuit, a first sensing and clamping circuit, a second driving circuit and a second sensing and clamping circuit. The first driving circuit is arranged for receiving a first AC-coupled signal to generate a first output signal at an output terminal of the first driving circuit. The first sensing and clamping circuit is coupled to the first driving circuit, and is arranged for clamping the output terminal of the first driving circuit at a fixed DC voltage. The second driving circuit is arranged for receiving a second AC-coupled signal to generate a second output signal at an output terminal of the second driving circuit. The second sensing and clamping circuit is coupled to the second driving circuit, and is arranged for clamping the output terminal of the second driving circuit at another fixed DC voltage; wherein the first AC-coupled signal and the second AC-coupled signal are a differential pair.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
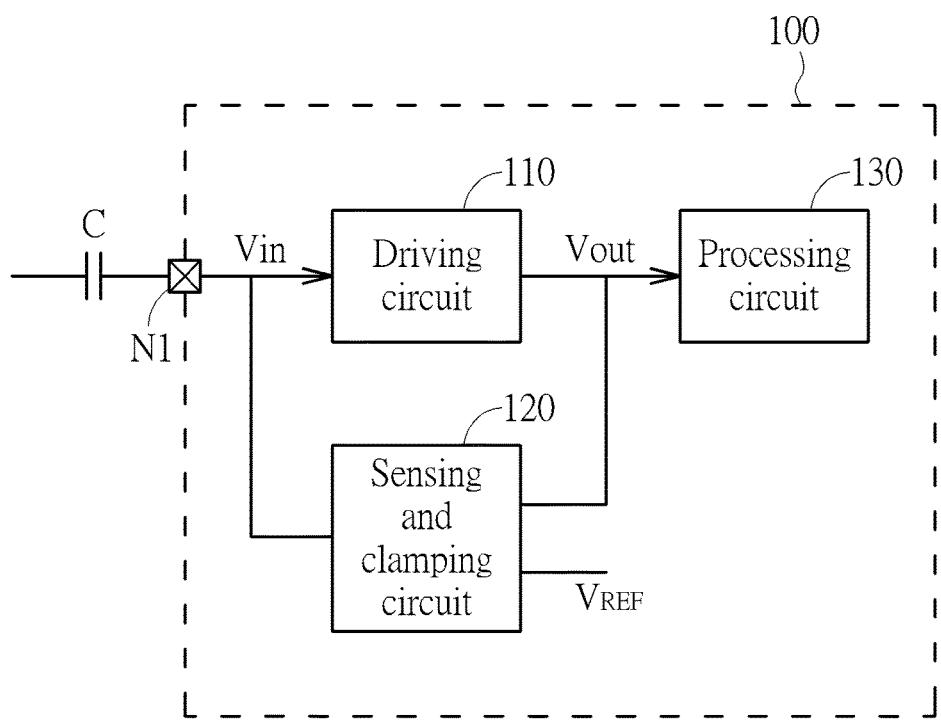
FIG. 1 is a diagram illustrating a chip according to one embodiment of the present invention.

Please refer to FIG. 1, which is a diagram illustrating a chip 100 according to one embodiment of the present invention. As shown in FIG. 1, the chip 100 comprises a pad N1, a driving circuit 110 serving as an input stage, a sensing and clamping circuit 120 and a processing circuit 130, where the pad N1 is coupled to an AC coupling capacitor C external to the chip 100. The chip 100 is applied to a TV system adopting a CVBS or VGA or any other audio/video standard.

In the operations of the chip 100, the driving circuit 110 can be implemented by a source follower to receive an AC-coupled signal Vin from the AC coupling capacitor C via the pad N1 to generate an output signal Vout, and the output signal Vout is inputted to the processing circuit 130. Meanwhile, the sensing and clamping circuit 120 is arranged to clamp the output terminal of the driving circuit 110 at a fixed DC voltage (e.g. a reference voltage $V_{REF}$ shown in FIG. 1), so as to make the driving circuit 110 have the better linearity.

The chip 100 shown in FIG. 1 is a conceptual block diagram, embodiments of the detailed structure of the chip 100 are described in the following figures and related disclosure.

Figure 2:
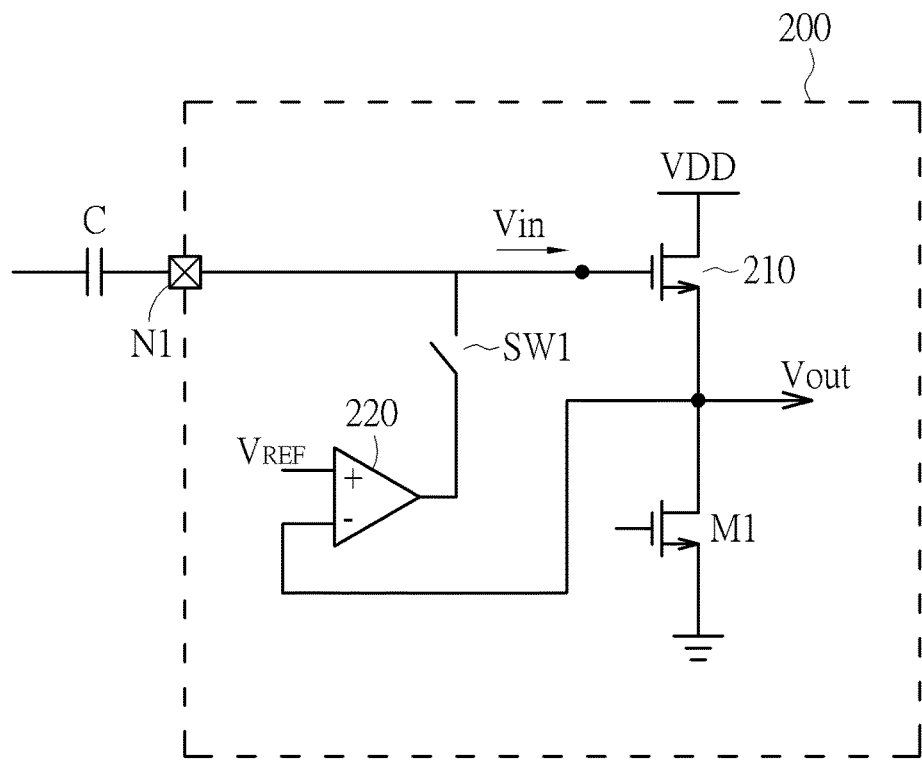
FIG. 2 is a diagram illustrating a chip according to one embodiment of the present invention.

Please refer to FIG. 2, which is a diagram illustrating a chip 200 according to another embodiment of the present invention. As shown in FIG. 2, the chip 200 comprises a pad N1, a source follower 210 serving as an input stage, a transistor M1 serving as a current source, an operational amplifier 220 serving as a sensing and clamping circuit, and a switch SW1. The source follower 210 is an open-loop source follower and is implemented by an NMOS, an input terminal of the source follower 210 is coupled to the pad N1, and the source follower 210 is arranged to receive an AC-coupled signal Vin from the AC coupling capacitor C via the pad N1 to generate an output signal Vout. A positive input terminal of the operational amplifier 220 is coupled to a reference voltage $V_{REF}$ generated from a bandgap voltage generator, a negative input terminal of the operational amplifier 220 is coupled to an output terminal of the source follower 210, and an output terminal of the operational amplifier 220 is coupled to the input terminal of the source follower 210 via the switch SW1.

By using the circuit structure shown in FIG. 2, the output terminal of the source follower 210 can be clamped at a fixed DC voltage, that is the reference voltage $V_{REF}$, and this fixed DC voltage is independent of the input signal Vin and process, voltage and temperature (PVT) variation of the source follower 210. Therefore, the linearity of the source follower 210 can be improved.

In addition, In this embodiment, a DC voltage of the input terminal of the source follower 210 is not directly clamped by any clamping circuit, and the DC voltage of the input terminal of the source follower 210 is determined based on the fixed DC voltage (i.e. $V_{REF}$) at the output terminal and a gate-source voltage (Vgs) of the source follower 210.

In addition, the switch SW1 is an optional element, and is arranged to enable or disable the clamping function. In detail, when the switch SW1 is on, the output terminal of the source follower 210 is clamped at the reference voltage $V_{REF}$; and when the switch SW1 is off, the output terminal of the source follower 210 is not clamped by the operational amplifier 220.

Figure 3:
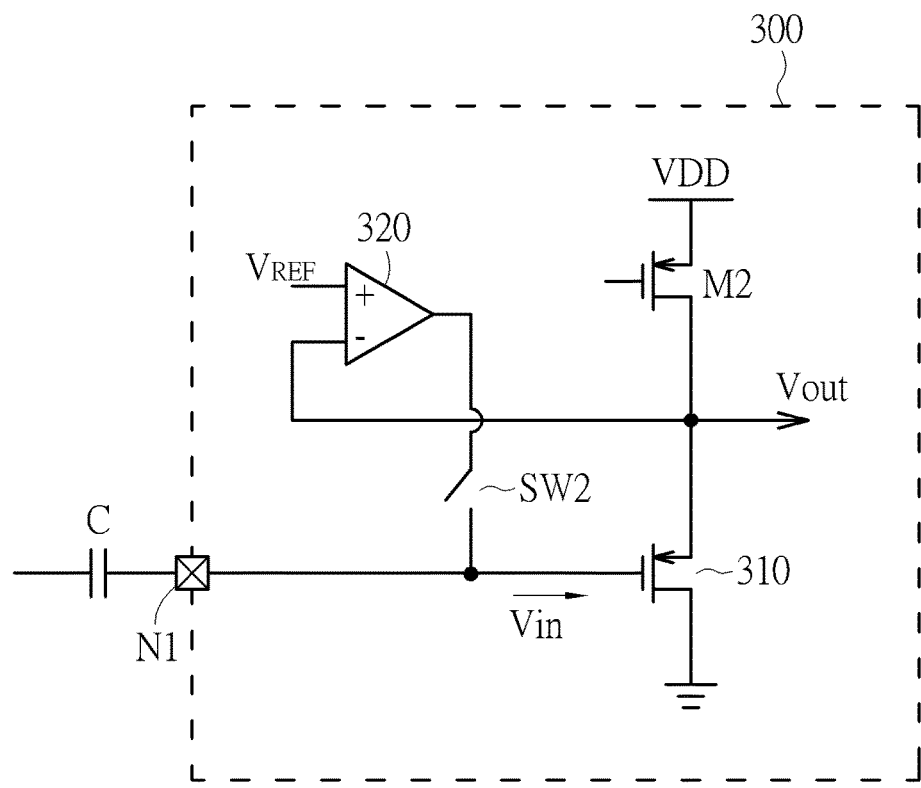
FIG. 3 is a diagram illustrating a chip according to another embodiment of the present invention.

Please refer to FIG. 3, which is a diagram illustrating a chip 300 according to another embodiment of the present invention. As shown in FIG. 3, the chip 300 comprises a pad N1, a source follower 310 serving as an input stage, a transistor M2 serving as a current source, an operational amplifier 320 serving as a sensing and clamping circuit, and a switch SW2. The source follower 310 is an open-loop source follower and is implemented by a PMOS, an input terminal of the source follower 310 is coupled to the pad N1, and the source follower 310 is arranged to receive an AC-coupled signal Vin from the AC coupling capacitor C and the pad N1 to generate an output signal Vout. A positive input terminal of the operational amplifier 320 is coupled to a reference voltage $V_{REF}$ generated from a bandgap voltage generator, a negative input terminal of the operational amplifier 320 is coupled to an output terminal of the source follower 310, and an output terminal of the operational amplifier 320 is coupled to the input terminal of the source follower 310 via the switch SW2. In this embodiment, a DC voltage of the input terminal of the source follower 310 is not directly clamped by any clamping circuit, and the DC voltage of the input terminal of the source follower 310 is determined based on the fixed DC voltage (i.e. $V_{REF}$) at the output terminal and a gate-source voltage (Vgs) of the source follower 310. By using the circuit structure shown in FIG. 3, the output terminal of the source follower 310 can be clamped at a fixed DC voltage, that is the reference voltage $V_{REF}$, and this fixed voltage is independent of the input signal Vin and PVT variation of the source follower 310. Therefore, the linearity of the source follower 310 can be improved.

In addition, the switch SW2 is an optional element, and is arranged to enable or disable the clamping function. In detail, when the switch SW2 is on, the output terminal of the source follower 310 is clamped at the reference voltage $V_{REF}$; and when the switch SW2 is off, the output terminal of the source follower 310 is not clamped by the operational amplifier 320.

Figure 4:
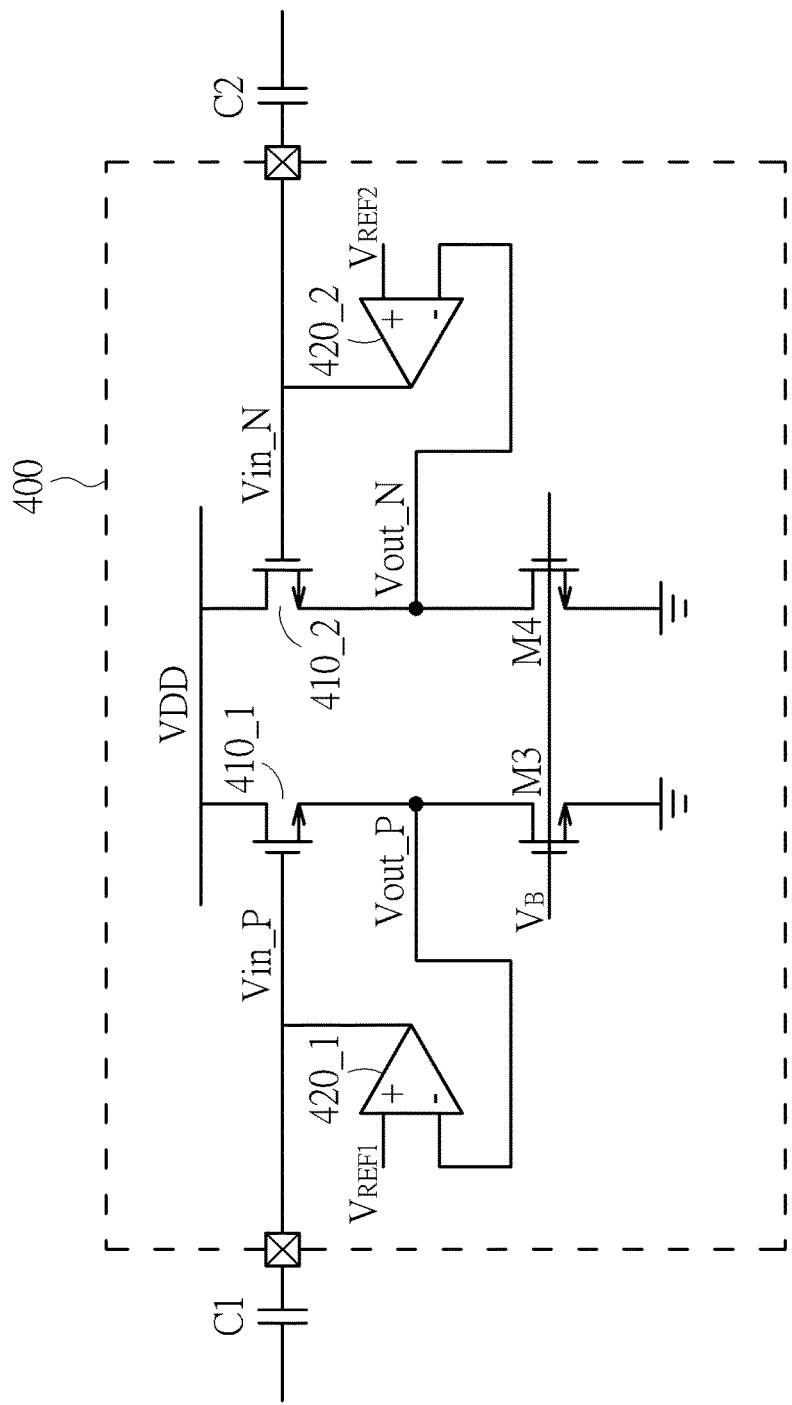
FIG. 4 is a diagram illustrating a chip according to another embodiment of the present invention.

Please refer to FIG. 4, which is a diagram illustrating a chip 200 according to another embodiment of the present invention. As shown in FIG. 4, the chip 400 comprises two pads N1 and N2, two source followers 410_1 and 410_2 serving as an input stage, two transistors M3 and M4 serving as current sources controlled by a bias VB, and two operational amplifiers 420_1 and 420_2 serving as sensing and clamping circuits. The source follower 410_1 is an open-loop source follower and is implemented by an NMOS, an input terminal of the source follower 410_1 is coupled to the pad N1, and the source follower 410_1 is arranged to receive an AC-coupled signal Vin_P from the AC coupling capacitor C1 and the pad N1 to generate an output signal Vout_P. A positive input terminal of the operational amplifier 420_1 is coupled to a reference voltage $V_{REF1}$ generated from a bandgap voltage generator, a negative input terminal of the operational amplifier 420_1 is coupled to an output terminal of the source follower 410_1, and an output terminal of the operational amplifier 420_1 is coupled to the input terminal of the source follower 410_1. In addition, the source follower 410_2 is an open-loop source follower and is implemented by an NMOS, an input terminal of the source follower 410_2 is coupled to the pad N2, and the source follower 410_2 is arranged to receive an AC-coupled signal Vin_N from the AC coupling capacitor C2 and the pad N2 to generate an output signal Vout_N. A positive input terminal of the operational amplifier 420_2 is coupled to a reference voltage $V_{REF2}$ generated from a bandgap voltage generator, a negative input terminal of the operational amplifier 420_2 is coupled to an output terminal of the source follower 410_2 and an output terminal of the operational amplifier 420_2 is coupled to the input terminal of the source follower 410_2. In this embodiment, the AC-coupled signal Vin_P and the AC-coupled signal Vin_N are a differential pair.

In addition, in this embodiment, DC voltages of the input terminals of the source followers 410_1 and 410_2 are not directly clamped by any clamping circuit, and the DC voltages of the input terminals of the source followers 410_1 and 410_2 are determined based on the fixed DC voltages (i.e. $V_{REF1}$ and $V_{REF2}$) at the output terminals and gate-source voltages (Vgs) of the source followers 410_1 and 410_2, respectively.

By using the circuit structure shown in FIG. 4, the output terminal of the source followers 410_1 and 410_2 can be clamped at fixed DC voltages, that is the reference voltages $V_{REF1}$ and $V_{REF2}$, respectively, and these fixed voltages are independent of the input signals Vin_P/Vin_N and PVT variation of the source followers 410_1 and 410_2. Therefore, the linearity of the source followers 410_1 and 410_2 can be improved.

In another embodiment, one or more switches can be positioned between the output terminal of the operational amplifier 420_1/420_2 and the input terminal of the source follower 410_1/410_2 to enable or disable the clamping function. This alternative design shall fall within the scope of the present invention.

In addition, in another embodiment, the NMOS source followers 410_1 and 410_2 and the NMOS current sources M3 and M4 can be replaced by PMOS elements as shown in FIG. 3. Because a person skilled in the art should understand how to design the detailed circuits after reading the embodiments shown in FIG. 3 and FIG. 4, further descriptions are omitted here.

In the above embodiments, each of the reference voltage $V_{REF}$, $V_{REF1}$ and $V_{REF2}$ is generated from a bandgap voltage generator, that is each of the reference voltage $V_{REF}$, $V_{REF1}$ and $V_{REF2}$ tracks a bandgap voltage robust to PVT variation. In another embodiment, however, at least a portion of the reference voltage $V_{REF}$, $V_{REF1}$ and $V_{REF2}$ can be generated by dividing a supply voltage VDD, that is the reference voltage $V_{REF}$, $V_{REF1}$ and/or $V_{REF2}$ tracks the supply voltage VDD to maximize headroom of the source follower.

Figure 5:
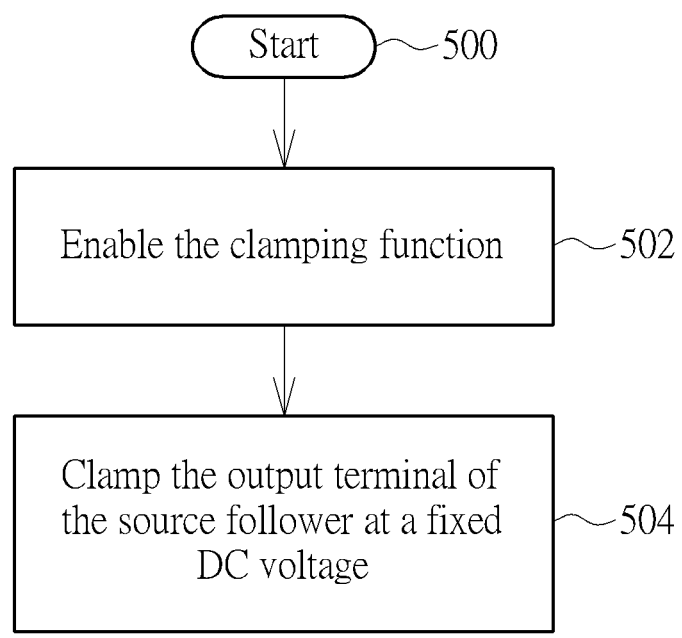
FIG. 5 is a flowchart of a method for controlling a source follower within a chip according to one embodiment of the present invention.

FIG. 5 is a flowchart of a method for controlling a source follower within a chip according to one embodiment of the present invention. Referring to FIGS. 1-5 together, the flow is as follows.

Step 500: the flow starts.
Step 502: enable the clamping function.
Step 504: clamp the output terminal of the source follower at a fixed DC voltage.

Briefly summarized, in the input stage of the present invention, by clamping the output terminal of the source follower at a fixed DC voltage, the linearity of the source follower can be improved, and potential reliability issue can also be avoided if low-voltage devices are used in succeeding circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip, comprising:
a first driving circuit, for receiving a first AC-coupled signal to generate a first output signal at an output terminal of the first driving circuit;
a first sensing and clamping circuit, coupled to the first driving circuit, for clamping the output terminal of the first driving circuit at a fixed DC voltage;
a second driving circuit, for receiving a second AC-coupled signal to generate a second output signal at an output terminal of the second driving circuit; and
a second sensing and clamping circuit, coupled to the second driving circuit, for clamping the output terminal of the second driving circuit at another fixed DC voltage;
wherein the first AC-coupled signal and the second AC-coupled signal are a differential pair.

2. The chip of claim 1, wherein the first driving circuit and the second driving circuit serve as an input stage of the chip, and the first AC-coupled signal and the second AC-coupled signal are directly from pads of the chip.

3. The chip of claim 1, wherein a DC voltage of an input terminal of the first driving circuit is determined based on the fixed DC voltage at the output terminal of the first driving circuit, and a DC voltage of an input terminal of the second driving circuit is determined based on the another fixed DC voltage at the output terminal of the second driving circuit.

4. The chip of claim 3, wherein the DC voltage of the input terminal of the first second driving circuit or the DC voltage of the input terminal of the second driving circuit is not directly clamped by any voltage clamping circuit.

5. The chip of claim 1, wherein each one of the first driving circuit and the second driving circuit is an open-loop source follower.

6. An input stage of a chip, comprising:
a source follower, for receiving an AC-coupled signal to generate an output signal at an output terminal; and
a sensing and clamping circuit, coupled to the source follower, for clamping the output terminal of the source follower at a fixed DC voltage;
wherein the sensing and clamping circuit comprises an operational amplifier, one input terminal of the operational amplifier is directly connected to a reference voltage, another input terminal of the operational amplifier is coupled to the output terminal of the source follower, and an output signal generated by the operational amplifier is directly inputted to an input terminal of the source follower.

7. The input stage of claim 6, wherein the chip comprises a pad, and the source follower directly receives the AC-coupled signal from the pad.

8. The input stage of claim 6, wherein an output terminal of the operational amplifier is coupled to an input terminal of the source follower.

9. The input stage of claim 8, wherein the sensing and clamping circuit further comprises a switch coupled between the input terminal of the source follower and the output terminal of the operational amplifier, and the switch is arranged to selectively connect the input terminal of the source follower to the output terminal of the operational amplifier or not.

10. The input stage of claim 6, wherein a DC voltage of an input terminal of the source follower is determined based on the fixed DC voltage at the output terminal of the source follower.

11. The input stage of claim 10, wherein the DC voltage of the input terminal of the source follower is not directly clamped by any voltage clamping circuit.

12. The input stage of claim 6, wherein the source follower is an open-loop source follower.

13. A method for controlling a source follower within a chip, wherein the source follower for receiving an AC-coupled signal to generate an output signal at an output terminal, and the method comprises:
clamping the output terminal of the source follower at a fixed DC voltage;
wherein the step of clamping the output terminal of the source follower at the fixed DC voltage comprises:
providing an operational amplifier, wherein one input terminal of the operational amplifier is directly connected to a reference voltage, another input terminal of the operational amplifier is coupled to the output terminal of the source follower, and an output signal generated by the operational amplifier is directly inputted to an input terminal of the source follower, to clamp the output terminal of the source follower at the fixed DC voltage.

14. The method of claim 13, wherein the chip comprises a pad, and the source follower directly receives the AC-coupled signal from the pad.

15. The method of claim 13, wherein an output terminal of the operational amplifier is coupled to an input terminal of the source follower.

16. The method of claim 15, further comprising:
selectively connecting the input terminal of the source follower to the output terminal of the operational amplifier or not.

17. The method of claim 13, further comprising:
not directly clamping an input terminal of the source follower at any fixed DC voltage by using a voltage clamping circuit.

* * * * *